(12) United States Patent
Yoneda et al.

(10) Patent No.: US 9,667,213 B2
(45) Date of Patent: May 30, 2017

(54) AUDIO SIGNAL PROCESSING DEVICE FOR ADJUSTING VOLUME

(71) Applicant: SONY CORPORATION, Tokyo (JP)

(72) Inventors: Michiaki Yoneda, Kanagawa (JP); Kazunobu Ookuri, Kanagawa (JP); Ayumi Kakema, Tokyo (JP)

(73) Assignee: SONY CORPORATION, Tokyo (JP)

( * ) Notice: Subject to any disclaimer, the term of this patent is extended or adjusted under 35 U.S.C. 154(b) by 140 days.

(21) Appl. No.: 14/638,638

(22) Filed: Mar. 4, 2015

(65) Prior Publication Data

US 2015/0263689 A1 Sep. 17, 2015

(30) Foreign Application Priority Data

Mar. 11, 2014 (JP) ................................. 2014-047715

(51) Int. Cl.
| | |
|---|---|
| *H03G 3/00* | (2006.01) |
| *H03G 3/30* | (2006.01) |
| *H03G 5/16* | (2006.01) |
| *H04R 3/00* | (2006.01) |
| *H04R 1/28* | (2006.01) |
| *H04R 9/02* | (2006.01) |

(52) U.S. Cl.
CPC ............ *H03G 3/3005* (2013.01); *H03G 5/16* (2013.01); *H04R 3/00* (2013.01); *H04R 1/2819* (2013.01); *H04R 9/027* (2013.01); *H04R 2430/01* (2013.01); *H04R 2430/03* (2013.01); *H04R 2499/11* (2013.01); *H04R 2499/15* (2013.01)

(58) Field of Classification Search
CPC ...... H04R 3/00; H04R 3/007; H04R 2430/01; H03G 5/16
USPC .................................................. 381/104, 107
See application file for complete search history.

(56) References Cited

U.S. PATENT DOCUMENTS

| 5,467,393 A * | 11/1995 | Rasmusson ......... H04M 1/6016 |
| | | 379/388.01 |
| 2008/0025530 A1* | 1/2008 | Romesburg ............... H03F 3/68 |
| | | 381/107 |
| 2009/0287496 A1* | 11/2009 | Thyssen ................. H03G 7/007 |
| | | 704/500 |
| 2012/0328127 A1* | 12/2012 | Ogasahara ............. H03G 9/025 |
| | | 381/107 |
| 2013/0051605 A1* | 2/2013 | Tagami ................. H04R 9/027 |
| | | 381/414 |

FOREIGN PATENT DOCUMENTS

| JP | 2005-260470 A | 9/2005 |
| JP | 2009-065427 A | 3/2009 |
| JP | 2012-114953 A | 6/2012 |

* cited by examiner

*Primary Examiner* — Paul S Kim
*Assistant Examiner* — Katherine Faley
(74) *Attorney, Agent, or Firm* — Chip Law Group

(57) ABSTRACT

An audio signal processing device includes a volume setting unit that changes a volume of an audio signal according to a control for changing the volume, and a level control unit that controls a level of a predetermined band of the audio signal according to the control.

11 Claims, 10 Drawing Sheets

FIG. 4

| LEVEL | VOLUME A [dB] | NOTCH FILTER PARAMETER | fs[Hz] | a0 | a1 | a2 | b1 | b2 |
|---|---|---|---|---|---|---|---|---|
| L5 | A>MAX−2.0 | f0 = 200 Hz<br>Q = 2<br>GAIN = −10 dB | 32000<br>44100<br>48000 | 0.97941267<br>0.984936357<br>0.986135372 | −1.93828757<br>−1.95514555<br>−1.9587752 | 0.960370406<br>0.971003231<br>0.973311277 | 1.938287574<br>1.951145555<br>1.958775195 | −0.93978308<br>−0.95593959<br>−0.95944665 |
| L4 | A>MAX−4.0<br>&<br>A≤MAX−2.0 | f0 = 200 Hz<br>Q = 2<br>GAIN = −8 dB | 32000<br>44100<br>48000 | 0.985515435<br>0.989419408<br>0.990265114 | −1.95036513<br>−1.96404462<br>−1.96697816 | 0.966354519<br>0.975422864<br>0.977387314 | 1.950365133<br>1.964044624<br>1.966978162 | −0.95186995<br>−0.96484227<br>−0.96765243 |
| L3 | A>MAX−6.0<br>&<br>A≤MAX−4.0 | f0 = 200 Hz<br>Q = 2<br>GAIN = −6 dB | 32000<br>44100<br>48000 | 0.990417502<br>0.99300961<br>0.993570217 | −1.96006647<br>−1.97117135<br>−1.97354314 | 0.971161277<br>0.978962278<br>0.980649435 | 1.960066474<br>1.971171347<br>1.973543136 | −0.96157878<br>−0.97197189<br>−0.97421965 |
| L2 | A>MAX−8.0<br>&<br>A≤MAX−6.0 | f0 = 200 Hz<br>Q = 2<br>GAIN = −4 dB | 32000<br>44100<br>48000 | 0.994346244<br>0.995880031<br>0.996211317 | −1.96784157<br>−1.97686927<br>−1.97878919 | 0.975013634<br>0.981792093<br>0.98325619 | 1.967841573<br>1.976869268<br>1.978789193 | −0.96935988<br>−0.97767212<br>−0.97946751 |
| L1 | A>MAX−10.0<br>&<br>A≤MAX−8.0 | f0 = 200 Hz<br>Q = 2<br>GAIN = −2 dB | 32000<br>44100<br>48000 | 0.997489237<br>0.99817194<br>0.998319245 | −1.97406165<br>−1.98141882<br>−1.9829762 | 0.978095519<br>0.984051581<br>0.985336706 | 1.974061652<br>1.981418818<br>1.982976202 | −0.97558476<br>−0.98222352<br>−0.98365595 |
| L0 | A≤MAX−10.0 | f0 = 200 Hz<br>Q = 2<br>GAIN = 0 dB | 32000<br>44100<br>48000 | 1<br>1<br>1 | −1.97903053<br>−1.9850476<br>−1.98631471 | 0.980557467<br>0.985853781<br>0.986995603 | 1.979030529<br>1.985047604<br>1.986314709 | −0.98055747<br>−0.98585378<br>−0.989956 |

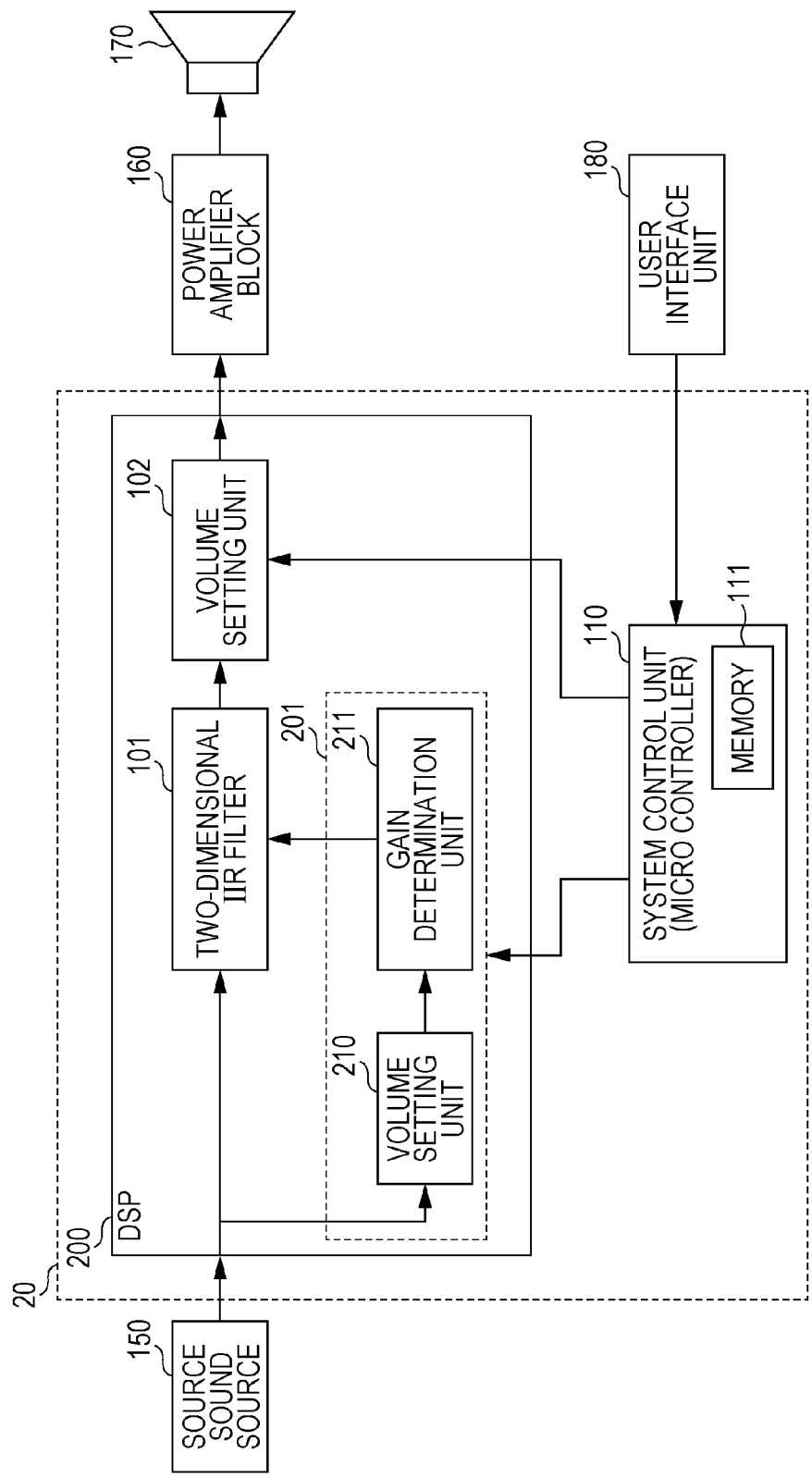

SMALL CUT GAIN

GREAT CUT GAIN

ACTUAL MUSIC SIGNAL

AUDIO SIGNAL PROCESSING DEVICE FOR ADJUSTING VOLUME

CROSS REFERENCE TO RELATED APPLICATIONS

This application claims the benefit of Japanese Priority Patent Application JP 2014-047715 filed Mar. 11, 2014, the entire contents of which are incorporated herein by reference.

BACKGROUND

The present disclosure relates to an audio signal processing device and an audio signal processing method.

In recent years, for the purpose of high efficiency of a structure of a speaker unit, or an improvement of the quality of a sound that is reproduced by a speaker unit, a speaker unit with a damperless structure having no mechanical damper has been proposed. As an example of a speaker unit with a damperless structure, a speaker unit has been proposed, which is filled with magnetic fluid having a viscosity, in a magnetic pole gap formed in the periphery of a voice coil, in Japanese Unexamined Patent Application Publication No. 6-014394 and Japanese Unexamined Patent Application Publication No. 2013-046112.

SUMMARY

Meanwhile, also in a speaker unit with the above-described damperless structure, it is necessary to reproduce an audio signal using a high sound pressure. If a vibration plate is vibrated to produce a sound pressure, an amplitude of the vibration plate exceeds a design limit value, and thus a problem in which the vibration plate may come to over-amplitude occurs.

It is desirable to produce an audio signal processing device and an audio signal processing method that maintain a sound pressure of a sound to be reproduced as far as possible, and prevent a vibration plate of a speaker unit from coming to over-amplitude.

According to an embodiment of the present disclosure, there is provided an audio signal processing device including: a volume setting unit that changes a volume of an audio signal according to a control for changing the volume; and a level control unit that controls a level of a predetermined band of the audio signal according to the control, for example.

According to another embodiment of the present disclosure, there is provided an audio signal processing method of an audio signal processing device, including: changing a volume of an audio signal according to a control for changing the volume; and controlling a level of a predetermined band of the audio signal according to the control, for example.

According to at least one embodiment, it is possible to maintain a sound pressure of a sound to be reproduced as far as possible, and to prevent a vibration plate of a speaker unit from coming to over-amplitude. In addition, effects described herein are not necessarily limited, and may be one of the effects described in the present disclosure. In addition, the content of the present disclosure is not intended to be interpreted so as to be limited to the exemplified effects.

BRIEF DESCRIPTION OF THE DRAWINGS

FIG. 4 is a diagram illustrating an example of parameters that are set in a two-dimensional IIR filter;

FIG. 8 is a block diagram illustrating an example of a configuration of an audio signal processing device of a second embodiment according to the present disclosure;

DETAILED DESCRIPTION OF EMBODIMENTS

Hereinafter, a plurality of embodiments according to the present disclosure will be described with reference to the drawings. In addition, the description will be made in the following sequence.

1. First Embodiment
2. Second Embodiment
3. Modification Example

The following Embodiments are appropriate specific examples according to the present disclosure, and the content of the present disclosure is not limited to the embodiments or the like.

Further, "sounds" to be described later may refer to various sounds such as the human voice and musical sound.

1. First Embodiment

Example of Speaker Unit

To begin with, an example of a speaker unit according to the present disclosure will be described. A general speaker unit uses a damper in order to mechanically prevent a vibration plate from coming to over-amplitude. Here, the over-amplitude means a phenomenon in which a vibration plate vibrates beyond a design limit value in amplitude, for example. However, although a speaker unit that uses a damper can prevent over-amplitude, because the amplitude of a vibration plate is physically suppressed, there is a case where a distortion occurs in a sound that is reproduced, or a case where efficiency of the speaker unit is lowered.

Therefore, as described above, a speaker unit with a structure (damperless structure) in which a damper is not used is proposed, and as an example thereof, a speaker unit (if appropriate, also referred to as magnetic fluid speaker unit) in which magnetic fluid is filled in the periphery of a voice coil is proposed. For example, the magnetic fluid is formed by dispersing fine particles that are a magnetic material in water or oil using a surfactant, has saturation magnetic flux of 30 milliteslas (mT) to 40 mT, and has viscosity equal to or lower than 300 centipoises (cP) (=3 Pascal seconds (Pa·s)).

A magnetic fluid speaker unit that can output a sound with a high sound pressure is requested. If a vibration plate is vibrated by increasing a volume in order to produce a sound pressure, there is a possibility that an amplitude of the vibration plate exceeds a design limit value and thereby the vibration plate comes to over-amplitude. In a case where the vibration plate comes to over-amplitude, the magnetic fluid is scattered, and thereby there is a possibility that the speaker unit is broken.

Figure 1:
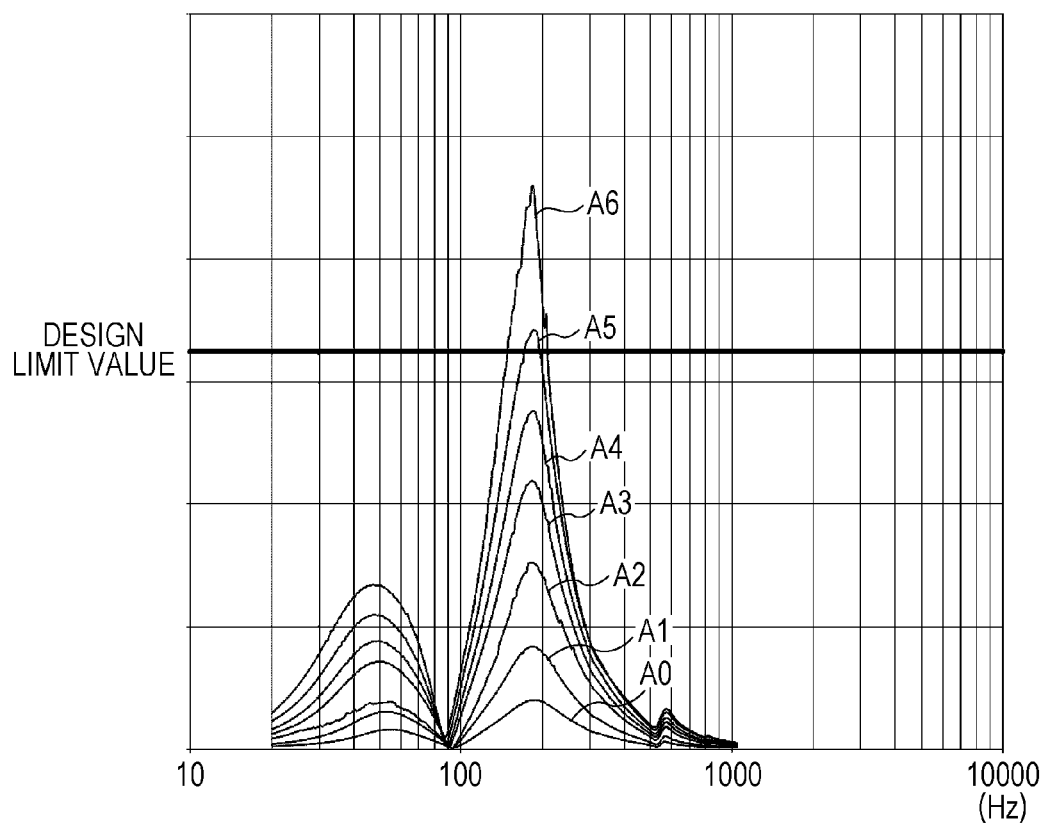
FIG. 1 is a diagram illustrating an example of characteristics of a magnetic fluid speaker unit.

FIG. 1 is a diagram illustrating an example of frequency characteristics of a bass reflex type speaker device using a magnetic fluid speaker unit. In FIG. 1, a horizontal axis denotes a frequency, and a vertical axis denotes a magnitude of the amplitude of the vibration plate (magnitude obtained when the vibration plate vibrates from a neutral position in a positive direction or a negative position (unit is millimeter (mm))). A plurality of curves A0, A1, A3 . . . A6 in FIG. 1 respectively correspond to a magnitude of a volume, and the volume increases from A0 to A6. In addition, the example of FIG. 1 is an example in which a magnetic fluid speaker unit is used as a speaker unit for mid-range, and a low band is electrically cut by a high pass filter (HPF). In addition, the periphery of 100 Hz becomes a port resonance frequency of a bass reflex type speaker device.

As illustrated in FIG. 1, as the volume is increased, the amplitude of the vibration plate becomes larger. Then, if the volume exceeds a predetermined volume (a magnitude of a volume denoted by A5 in example of FIG. 1), the amplitude of the vibration plate exceeds a design limit value in a band of the periphery of 200 Hz. That is, the vibration plate comes to over-amplitude, and magnetic fluid can be scattered. It is considered that, as an assumed technology (not the related art), a gain is lowered in such a manner that the amplitude of the vibration plate does not exceed a design limit value at a maximum volume. However, in this technology, since a sound pressure other than a band in which the vibration plate comes to over-amplitude is also lowered, there is a possibility in which volume sense that a user expects is damaged. The present disclosure for solving such a problem will be described.

In addition, the design limit value of the amplitude of the vibration plate of the speaker unit can be obtained by following actions, for example. First of all, combination of an amplifier and a speaker unit that are used is provided, and a test signal (tone burst signal) is input with respect to the amplifier. Then, it is possible to obtain the design limit value of the amplitude of the vibration plate by previously measuring an amplitude of the vibration plate of the speaker unit, a volume of the amplifier, a gain curve of the amplitude value or the like, using a laser displacement meter. Detailed description will be made later, but a center frequency, a bandwidth, and a gain of a filter that suppresses over-amplitude are determined in such a manner that the amplitude of the vibration plate does not exceed the design limit value.

Example of Audio Signal Reproduction System

Figure 2:
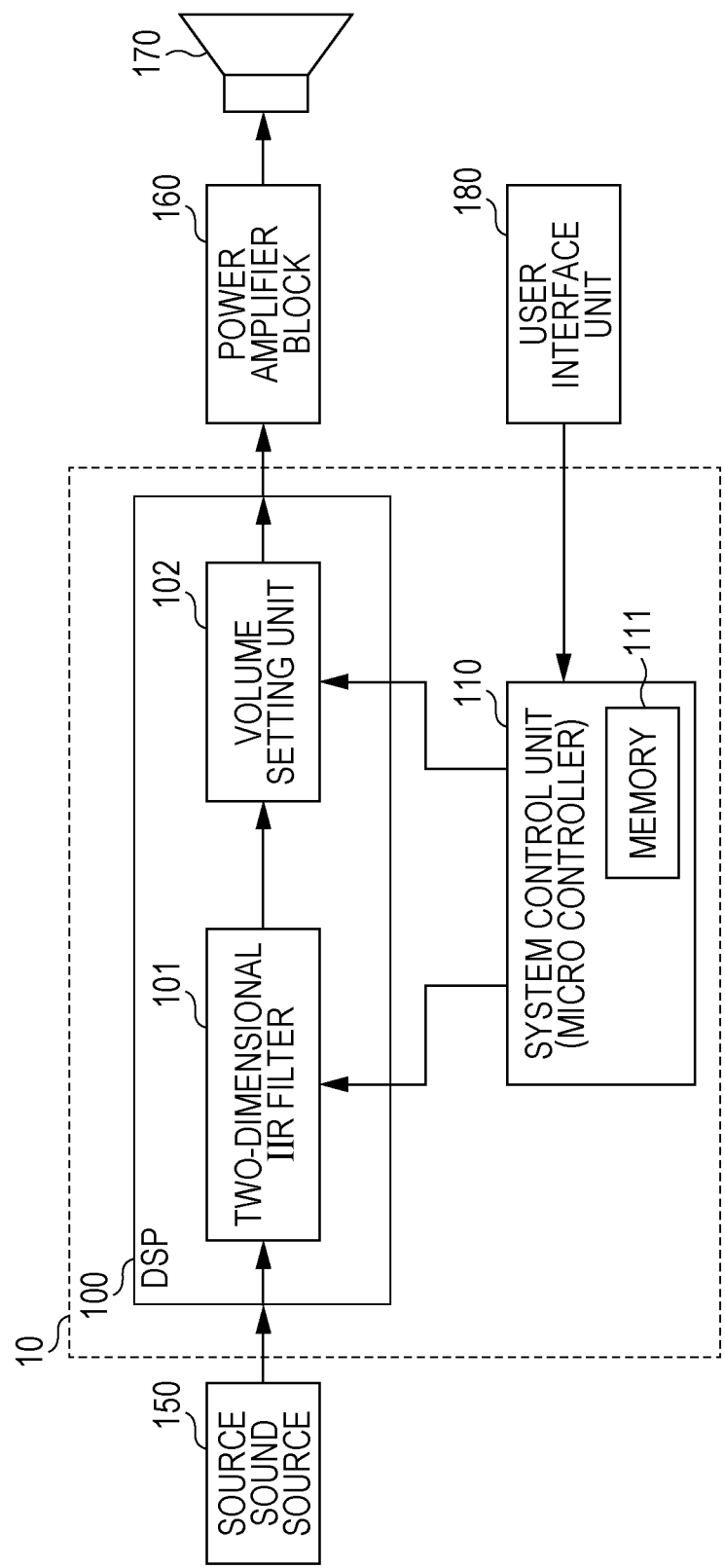
FIG. 2 is a block diagram illustrating an example of a configuration of an audio signal reproduction system of a first embodiment according to the present disclosure.

FIG. 2 is a diagram illustrating an example of a configuration of an audio signal reproduction system according to a first embodiment. For example, the audio signal reproduction system 1 includes an audio signal processing device 10, a source sound source 150, a power amplifier block 160, a speaker unit 170, and a user interface unit 180.

The audio signal processing device 10 includes a digital signal processor (DSP) 100, and a system control unit 110 configured with a micro computer, for example. The DSP 100 includes a two-dimensional infinite impulse response (IIR) filter 101, and a volume setting unit 102, for example. The system control unit 110 includes a memory 111 that is configured with a random access memory (RAM) or a read only memory (ROM), or the like. The memory 111 is configured with a single memory or a plurality of memories.

The source sound source 150 is connected to the audio signal processing device 10, and a digital audio signal is supplied from the source sound source 150 to the audio signal processing device 10. Predetermined signal processing is performed by the audio signal processing device 10 with respect to the digital audio signal that is supplied from the source sound source 150, and the digital audio signal in which the signal processing is performed is output from the audio signal processing device 10. In addition, the digital audio signal that is supplied from the source sound source 150 to the audio signal processing device 10 is appropriately referred to as an audio signal.

The power amplifier block 160 is connected to the audio signal processing device 10, and the speaker unit 170 is connected to the power amplifier block 160. The audio signal in which the signal processing is performed by the audio signal processing device 10 is supplied to the power amplifier block 160. Amplification processing is performed with a predetermined amplification rate by the power amplifier block 160, the speaker unit 170 is operated by an analog audio signal that is output from the power amplifier block 160, and a sound is reproduced. For example, the above-described magnetic fluid speaker unit is applied as the speaker unit 170.

The user interface unit 180 is connected to the audio signal processing device 10. An operation signal according to an operation with respect to the user interface unit 180 is generated, and the operation signal is supplied to the system control unit 110 of the audio signal processing device 10.

Each unit will be described in detail. The system control unit 110 of the audio signal processing device 10 controls each unit of the audio signal processing device 10, by executing a program stored in, for example, the memory 111. In addition to this, the memory 111 is used as a work memory or the like at the time of executing the program. The operation signal based on the operation of the user interface unit 180 is supplied to the system control unit 110. The system control unit 110 performs a control based on the operation signal.

For example, a serial communication is performed between the system control unit 110 and the DSP 100. The system control unit 110 transfers various set values for operating the DSP 100 or a filter coefficient of the two-dimensional IIR filter 101 to the DSP 100, using the serial communication. The filter coefficient or the like is transferred to the DSP 100 at an appropriate timing of turning on a power supply, at the time of switching a mode, at the time of performing an operation with respect to the user interface unit 180, or the like.

The filter coefficient that is transferred to the DSP 100 is stored in advance in, for example, the memory 111. The filter coefficient or the like may be supplied from the outside of the audio signal processing device 10, and may be configured to be stored in the memory 111.

The DSP 100 performs the known signal processing such as equalizing processing that varies a sound quality. FIG. 2 illustrates the two-dimensional IIR filter 101 and a volume setting unit 102, as a functional block with regard to processing according to the first embodiment. The two-dimensional IIR filter 101 functions as a suppression filter that suppresses a level of a predetermined band of the audio signal that is supplied from the source sound source 150, if necessary. The predetermined band is a band in which the speaker unit 170 comes to over-amplitude with a volume equal to or greater than a predetermined volume, and is approximately 200 Hz in a case where the speaker unit 170 is a magnetic fluid speaker unit. In addition, a filter other than the two-dimensional IIR filter may be used as the suppression filter. For example, the coefficient of the two-dimensional IIR filter 101 is set according to the control of the system control unit 110.

The volume setting unit 102 of the DSP 100 sets a level (gain) of the audio signal in such a manner that the sound is reproduced with the set volume. For example, if the volume is newly set by the operation with respect to the user interface unit 180, the system control unit 110 transfers a volume value indicating a changed volume to the volume setting unit 102. The volume setting unit 102 multiplies the volume value instructed by the system control unit 110, and the audio signal supplied from the source sound source 150 together. As a result, the sound is reproduced with the set volume.

In addition, a control of changing the volume is not limited to the operation performed by a user, and there is a case where the control is performed by an automatic volume change function that the device has. In conjunction with the control of changing the volume, the system control unit 110 performs a control of setting the coefficient with respect to the two-dimensional IIR filter 101.

The source sound source 150 is a sound source that supplies the audio signal to the audio signal processing device 10. The audio signal that is supplied from the source sound source 150 may be a signal that is read from a optical recording medium such as a compact disc (CD), a portable small memory, a hard disk, or the like, and may be a signal obtained via a network such as the Internet.

The audio signal from the source sound source 150 is, for example, a right (R) channel signal, and is a signal passed through an HPF with a predetermined cutoff frequency. Of course, the audio signal that is supplied from the source sound source 150 may be a left (L) channel signal. The source sound source 150 corresponds to stereo or multi-channels, and in a case where the audio signal is input to the audio signal processing device 10 for each channel, the same configuration corresponding to each channel is provided.

For example, the power amplifier block 160 which is configured as a digital amplifier includes an amplification stage performing a D-class operation. For example, the power amplifier block 160 has a configuration with a digital filter, a $\Delta\Sigma$ modulator, a PWM modulator, and an amplification output unit.

The audio signal with a predetermined sampling frequency and a quantized bit is input to the digital filter from the audio signal processing device 10. The digital filter performs digital signal processing such as resampling processing of increasing an original sampling frequency to predetermined multiples of the sampling frequency with respect to the audio signal that is input. In this way, the audio signal in which signal processing is performed by the digital filter is output to the $\Delta\Sigma$ modulator.

The $\Delta\Sigma$ modulator includes, for example, an integrator, a quantizer, and the like, and is configured so as to negatively feed back an output of the quantizer to an input of the integrator. By this configuration, a word length of the quantized bit of the audio signal is shortened to a predetermined number of bits. In addition, the quantized noise components occurring at this time move to a band higher than an audio band, and processing of so-called noise shaping is performed. This is called $\Delta\Sigma$ modulation, and when the audio signal is seen as a voice signal waveform, the audio signal in which the $\Delta\Sigma$ modulation is performed in this way, becomes a pulse train of one bit in which density is changed as "1" and "0", depending on a time axis change of an amplitude of the voice signal waveform. In this way, a $\Delta\Sigma$ modulation signal that is configured with the pulse train of one bit which is obtained in this way is input to the PWM modulator.

The PWM modulator performs pulse width modulation (PWM) processing with respect to the $\Delta\Sigma$ modulation signal which is input. As described above, the $\Delta\Sigma$ modulation signal is a pulse train of one bit in which the density of "1" and "0" changes depending on the amplitude of the voice signal waveform. Then, by performing the PWM with respect to the signal, a PWM signal in which a pulse width is changed (amplitude is constant) depending on the density of "1" and "0", is generated. That is, a signal is obtained, a pulse width of which is varied depending on the amplitude of the voice signal waveform corresponding to the $\Delta\Sigma$ modulation signal.

The PWM signal that is output from the PWM modulator is received by the amplification output unit. The amplification output unit, as is known, is configured with a switching amplification circuit that switches and amplifies the PWM signal, and a low pass filter for converting the amplified output into the voice signal waveform. The switching amplification circuit includes, for example, an N channel power metal oxide semiconductor field effect transistor (MOSFET) that can perform switching at a high voltage, for example. In addition, the low pass filter, as is known, employs an LC low pass filter that is configured to include an inductor and a capacitor.

In the amplification output unit, to begin with, the switching amplification circuit switches and amplifies the PWM signal that is input from the PWM modulator, and an amplification operation is performed by making the signal pass through the low pass filter. As a result, a drive current with the voice signal waveform flows through the speaker unit 170, and for example, a voice is output from the speaker unit 170.

The power amplifier block 160 is not limited to a digital amplifier including an amplification stage performing a D-class operation, and may be an amplifier including an amplification stage performing other operations (B-class, AB-class, or the like). In addition, a digital to analog (D/A) converter may be provided between the DSP 100 and the power amplifier block 160 to realize an amplifier of inputting analog signal.

For example, the speaker unit 170 is configured as a magnetic fluid speaker unit that reproduces a mid-range signal. A speaker device is configured with a plurality of speaker units including the speaker unit 170. For example, the speaker device is configured by attaching a speaker unit for a woofer, a speaker unit for a subwoofer, a speaker unit for a mid-range signal, and a speaker unit for a tweeter, to an enclosure.

In addition, it is not necessary for the structure of each speaker unit that configures the speaker device to be the same. For example, a speaker unit having a mechanical damper may be used as the speaker unit for a woofer and the speaker unit for a subwoofer, and a magnetic fluid speaker unit may be used as the speaker unit for a mid-range signal and the speaker unit for a tweeter. In addition, the bands of the sounds that are reproduced by each speaker unit may be overlapped with each other.

The user interface unit 180 is an operation unit, such as buttons, or dials through which a user operates the audio signal processing device 10. For example, the user interface unit 180 includes an operation unit that is used for changing a volume. The user interface unit 180 may be a remote control device for remotely operating the audio signal processing device 10. The user interface unit 180 may have a configuration including a display unit. A reproduction state of a sound, or the like performed by the audio signal processing system, may be displayed on the display unit. The display unit may be configured as a touch panel.

The user interface unit 180 generates an operating signal according to an operation. The operation signal is supplied to the system control unit 110. The system control unit 110 that receives the operation signal controls each unit of the audio signal processing device 10 in such a manner that a function responding to operation is performed.

As described above, an example of the audio signal reproduction system including the audio signal processing device is described. In addition, the configuration illustrated in FIG. 2 is an example, and a configuration or a functional block different from the illustrated configuration may be appropriately added.

With Regard to Two-Dimensional IIR Filter

Figure 3:
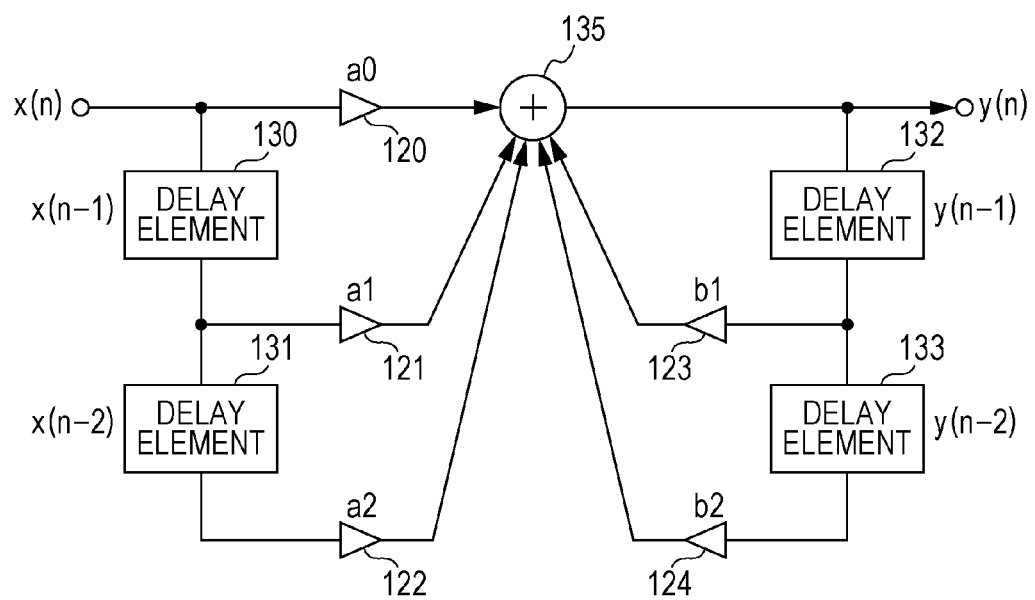
FIG. 3 is a diagram illustrating an example of a configuration of a two-dimensional IIR filter.

FIG. 3 illustrates an example of a configuration of a two-dimensional IIR filter 101. The two-dimensional IIR filter 101 includes a multiplier 120, a multiplier 121, a multiplier 122, a multiplier 123, and a multiplier 124. The two-dimensional IIR filter 101 includes a delay element 130, a delay element 131, a delay element 132, and a delay element 133.

The multiplier 120 multiplies an input signal x(n) by a coefficient a0. The delay element 130 delays the input signal x(n) for a predetermined period, and the delay element 131 further delays the signal that is delayed by the delay element 130 for a predetermined time. The multiplier 121 multiplies by a coefficient a1 a signal that is output from the delay element 130. The multiplier 122 multiplies by a coefficient a2 a signal that is output from the delay element 131.

The delay element 132 delays the output signal y(n) for a predetermined period, and the delay element 133 further delays the signal that is delayed by the delay element 132 for a predetermined time. The multiplier 123 multiplies by a coefficient b1 a signal that is output from the delay element 132. The multiplier 124 multiplies by a coefficient b2 a signal that is output from the delay element 133. An adder 135 adds signals that are output from each multiplier and outputs the added signals. The coefficients (coefficient a0, coefficient a1, coefficient a2, coefficient b1, coefficient b2) of each multiplier are set according to a control of the system control unit 110, for example.

Parameters of the two-dimensional IIR filter 101 are determined in such a manner that an amplitude of the vibration plate of the speaker unit 170 does not come to over-amplitude by exceeding a design limit value. A center frequency f0, a band width Q, and a gain (cut gain) are used as the parameters of the two-dimensional IIR filter 101. Here, as an example, the center frequency f0 is set to 200 Hz (band in which the vibration plate of the speaker unit 170 comes to over-amplitude with a volume equal to or greater than a predetermined volume), and the band width Q is set to 2. The gain is set according to a volume.

FIG. 4 illustrates an example of parameters that are set in the two-dimensional IIR filter 101. The parameters illustrated in FIG. 4 are stored in the memory 111 as a table, for example. The parameters may be supplied from an external apparatus of the audio signal processing device 10 so as to be stored.

In the example of FIG. 4, a maximum signal level of the audio single that is supplied from the source sound source 150 is set to 0 dB (decibel), and according to a level difference with regard to the maximum level, the volume levels are divided into six steps of a level L5, a level L4, a level L3, . . . and a level L0 sequentially from the highest level. Each step of the volume level is set to, for example, 2 dB. The parameters of the two-dimensional IIR filter 101 are set in correspondence to each volume level. For example, the parameters are a center frequency, a bandwidth, and a gain of the two-dimensional IIR filter 101, and coefficients that are set in each multiplier. The example of FIG. 4 is an example in which the amplitude of the vibration plate is included within a range of the design limit value, in a case where the volume level is in a smaller range than that of the level L0.

In the example of FIG. 4, a coefficient is set according to a sampling frequency fs of the audio signal. As a result, it is possible to set an appropriate coefficient according to the sampling frequency fs of the audio signal. It is not necessary to set the coefficient according to the sampling frequency fs of the audio signal necessarily. For example, the sampling frequency of the original audio signal may be resampled as a certain frequency, and only the coefficient corresponding to the resampled frequency may be stored. In addition, an appropriate coefficient may be calculated from the sampling frequency of the audio signal, and the center frequency, the band width, and the gain of the two-dimensional IIR filter 101 for each time. Furthermore, only the coefficient that is a reference may be retained, and the coefficient may be corrected.

For example, in the volume level L5 (range in which level is higher than MAX (0 dB)-2.0 dB) that is a maximum volume level, the center frequency is set to 200 Hz, the band width is set to 2, and the gain is set to −10 dB, as the parameters of the two-dimensional IIR filter 101. That is, the level of a predetermined band of the audio signal is significantly suppressed. In a case where the sampling frequency fs of the digital audio signal from the source sound source 150 is 48 kHz, the following coefficients are selected and set.

a0=0.986135372
a1=−1.9587752
a2=0.973311277
b1=1.958775195
b2=−0.95944665

In the volume level L4 in which the volume is one step less than that of the volume level L5, the center frequency is set to 200 Hz, the band width is set to 2, and the gain is set to −8 dB, as the parameters of the two-dimensional IIR filter 101. In a case where the sampling frequency fs of the digital audio signal from the source sound source 150 is 48 kHz, the following coefficients are selected and set.

a0=0.990265114
a1=−1.96697816
a2=0.977387314
b1=1.966978162
b2=−0.96765243

In the volume level L0 (range in which level is equal to or lower than MAX (0 dB)-10.0 dB) in which the volume is five steps lower than that of the volume level L5, the center frequency is set to 200 Hz, and the band width is set to 2, as the parameters of the two-dimensional IIR filter 101. In the volume level L0, in order to prevent the speaker unit 170 from coming to over-amplitude in the vicinity of 200 Hz, the gain is set to 0 dB. That is, the level of a predetermined band of the audio signal is not suppressed. In a case where the sampling frequency fs of the digital audio signal from the source sound source 150 is 48 kHz, the following coefficients are selected and set.

a0=1
a1=−1.98631471
a2=0.986995603
b1=1.986314709
b2=−0.9869956

Alternatively, the following coefficients are selected and set, in such a manner that the audio signal passes through the two-dimensional IIR filter 101.

a0=1.0
a1=0.0
a2=0.0
b1=0.0
b2=0.0

Figure 5:
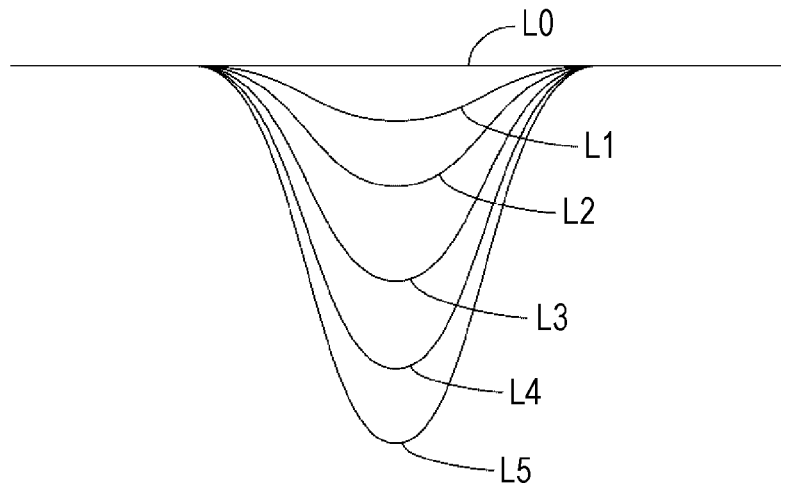
FIG. 5 is a diagram illustrating an example of characteristics of a two-dimensional IIR filter.

FIG. 5 schematically illustrates frequency characteristics of the two-dimensional IIR filter 101. An amount of cut gains of the two-dimensional IIR filter 101 is increased by increasing the volume level in the vicinity of 200 Hz.

As described above, in a case where the volume is greater than the set value (volume level L0 in the above-described example), a control for suppressing the level of a predetermined band of the audio signal is performed, and in a case where a level of the volume is lower than the set value, a control for suppressing the level of a predetermined band of the audio signal is not performed. As described in the above embodiment, in a case where the volume level is higher than the set value, a control for gradually suppressing the level of a predetermined band of the audio signal may be performed, depending on the magnitude.

Example of Operation of Audio Signal Processing Device

Figure 6:
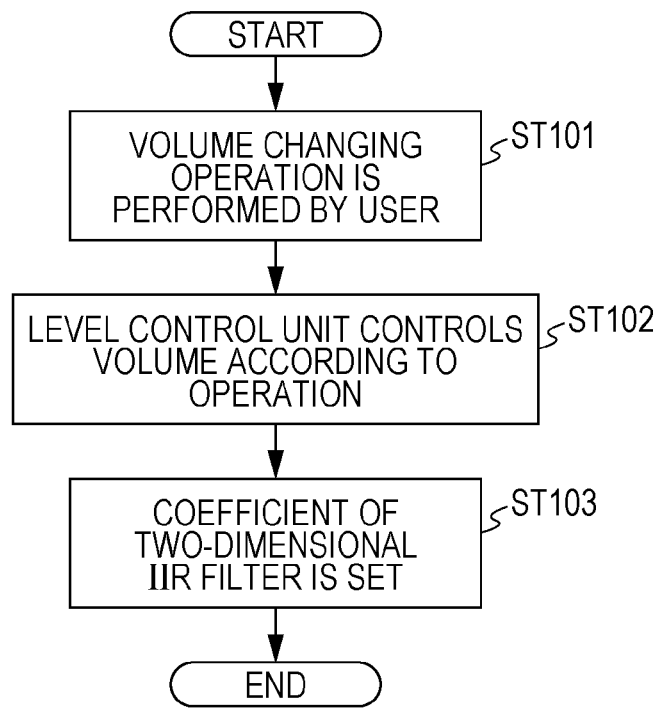
FIG. 6 is a flowchart illustrating an example of an operation of an audio signal processing device according to a first embodiment.

An example of an operation of the audio signal processing device 10 will be described with reference to FIG. 6. In step ST101, a user performs a volume changing operation using the user interface unit 180, for example. Then, the processing proceeds to step ST 102.

In step ST102, the volume setting unit 102 is controlled by the system control unit 110, in such a manner that the volume is adjusted to a volume according to the volume changing operation. Then, the processing proceeds to step ST103.

A control in ST103 is performed in conjunction with the control in step ST102. In step ST103, an appropriate coefficient of the two-dimensional IIR filter 101 is selected and set. In a case where the changed volume is greater than the set value, the coefficient of the two-dimensional IIR filter 101 is set in such a manner that the level of a predetermined band of the audio signal is suppressed, and thus it is possible to prevent the speaker unit 170 from coming to over-amplitude. Furthermore, since the level of only the predetermined band of the audio signal is suppressed and the other levels are not suppressed, it is possible to secure a maximum sound pressure. In addition, by suppressing the level of only the predetermined band of the audio signal, it is possible to prevent a user from feeling a decrease of a sound quality or reduction of a sound volume.

In the speaker unit with a structure in which a mechanical damper is included, it is not necessary to suppress a level of a band including 200 Hz in the audio signal. That is, in a case where the speaker device including the speaker unit 170 reproduces the band including 200 Hz and includes the speaker unit with a structure in which the mechanical damper is included, it is possible to prevent the level of a signal in the vicinity of 200 Hz from lowering.

Figure 7A:
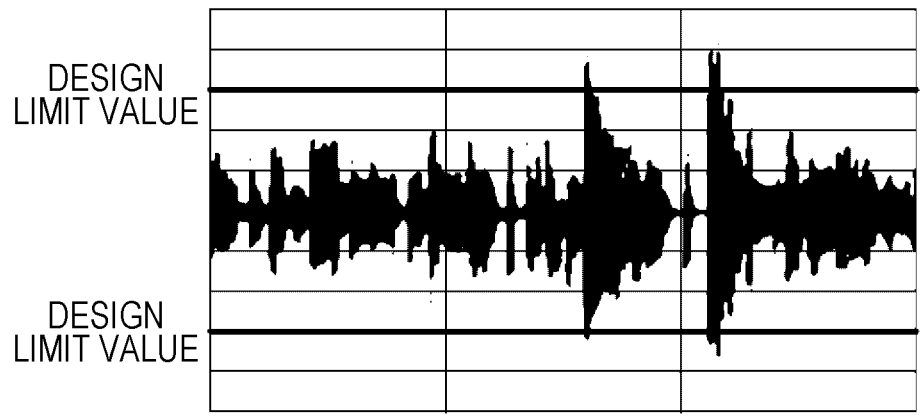
FIGS. 7A and 7B are diagrams illustrating an example of effects of a first embodiment according to the present disclosure.
Figure 7B:
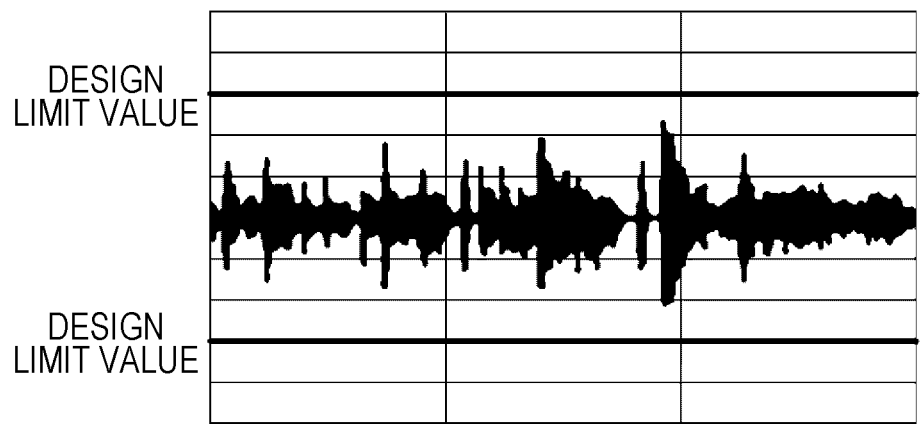

FIG. 7A illustrates an example of an amplitude of a vibration plate, in a case where the processing of a first embodiment according to the present disclosure is not applied. FIG. 7B illustrates an example of an amplitude of a vibration plate, in a case where the processing of a first embodiment according to the present disclosure is applied. Horizontal axes in FIGS. 7A and 7B denote time, and vertical axes denote a magnitude of an amplitude of the vibration plate. As can be seen from both the figures, by applying the processing of the first embodiment according to the present disclosure, the amplitude of the vibration plate is included within the range of a design limit value, and it is possible to prevent the vibration plate of the speaker unit from coming to over-amplitude. In addition, since the level of a band other than the band in which the vibration plate of the speaker unit comes to over-amplitude is not suppressed, it is possible to maintain a maximum sound pressure.

2. Second Embodiment

Next, a second embodiment will be described. The same symbols and reference numerals will be attached to the same configurations as those of the first embodiment, and description thereof will be appropriately omitted. In addition, unless otherwise described, those described in the first embodiment can be applied to the second embodiment.

Example of Configuration of Audio Signal Reproduction System

FIG. 8 illustrates an example of a configuration of an audio signal reproduction system according to the second embodiment. In the second embodiment, according to a control for changing a volume, a level of a digital audio signal from a source sound source is detected. According to the detection result, a gain of a two-dimensional IIR filter is dynamically controlled.

An audio signal reproduction system 2 includes a source sound source 150, an audio signal processing device 20, a power amplifier block 160, a speaker unit 170, and a user interface unit 180. The audio signal processing device 20 includes a system control unit 110 and a DSP 200. The DSP 200 includes a two-dimensional IIR filter 101, a volume setting unit 102, and a detection unit 201. The detection unit 201 includes a volume setting unit 210 and a gain determination unit 211. Audio data from the source sound source 150 is divided, one piece of audio data is input to the two-dimensional IIR filter 101, and the other piece of audio data is input to the volume setting unit 210 of the detection unit 201.

Figure 9:
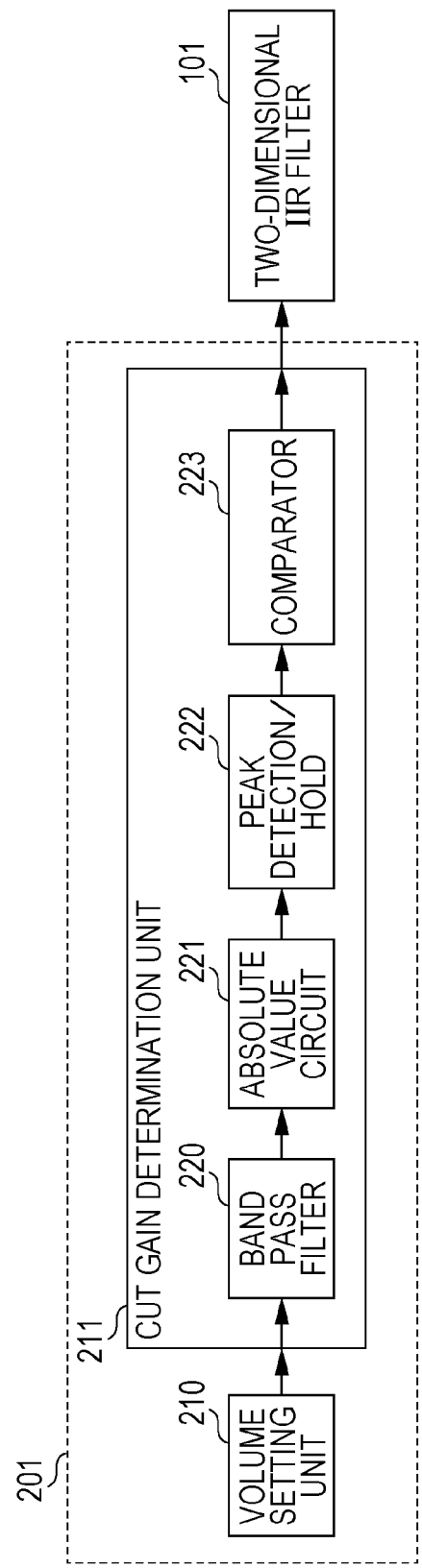
FIG. 9 is a block diagram illustrating an example of a configuration of a gain determination unit.

FIG. 9 is a diagram illustrating an example of a detailed configuration of the gain determination unit 211. The gain determination unit 211 includes a band pass filter (BPF) 220, an absolute value circuit 221, a peak detection/hold unit 222, and a comparator 223.

For example, the system control unit 110 performs processing of changing a volume, according to an operation for volume changing performed by a user. The system control unit 110 transfers a volume value indicating the changed volume to the volume setting unit 102 and the volume setting unit 210. The volume setting unit 210 changes the level of an audio signal by combining an audio signal and the transferred volume value. The volume setting unit 102 also performs the same processing. By the processing of the volume setting unit 210, the same audio signal as the audio signal that is supplied to the power amplifier block 160 from the volume setting unit 102 is generated.

The band pass filter 220 extracts a signal of a predetermined band of the digital audio signal that is supplied from the volume setting unit 210. The predetermined band is a band in the vicinity of the band at which the vibration plate of the speaker unit comes to over-amplitude with a volume equal to or greater than a predetermine volume. For example, a center frequency f0 is set to 200 Hz and a band width Q is set to 1, among the parameters of the band pass filter 220. The digital audio signal in which filter processing is performed by the band pass filter 220 is supplied to the absolute value circuit 221.

The absolute value circuit 221 takes an absolute value of the digital audio signal with positive and negative components. The absolute value circuit 221 may be a squaring circuit for squaring the level of the audio signal.

In the peak detection/hold unit 222, the absolute value that is supplied from the absolute value circuit 221 is stored with a predetermined time constant as a peak value. The peak detection/hold unit 222 compares the retained peak value with the newest absolute value that is supplied from the absolute value circuit 221, and retains the absolute value as a new peak value, in a case where the absolute value is greater than the peak value. Then, the retained peak value (peak hold value) is gradually attenuated with a predetermined time constant (for example, 0.5 seconds (s) as release time).

The comparator 223 compares the peak value that is supplied from the peak detection/hold unit 222 with a set level. The set level is a level corresponding to a design limit value of an amplitude of a vibration plate of the speaker unit 170. In a case where the peak value is greater than the set level, the DSP 200 calculates a necessary gain according to an amount exceeding the set level. Then, the DSP 200 seeks a coefficient (control value) for realizing a gain obtained from the calculation. This coefficient is set in the two-dimensional IIR filter 101. By the two-dimensional IIR filter 101, the level of a signal in a predetermined band of the audio signal is suppressed, if necessary.

For example, the processing of each unit of the gain determination unit 211 is periodically performed. For example, an absolute value with a level of a signal at a predetermined band of an incorporated audio signal is acquired in a certain period. The acquired absolute value is compared with a peak hold value, and it is determined whether or not the peak value is updated. In a case where the peak value is updated, the updated peak value is supplied to the comparator 223, and in a case where the peak value is not updated, the peak hold value or a value obtained by attenuating the peak hold value is supplied to the comparator 223.

Example of Operation of Audio Signal Processing Device

Figure 10:
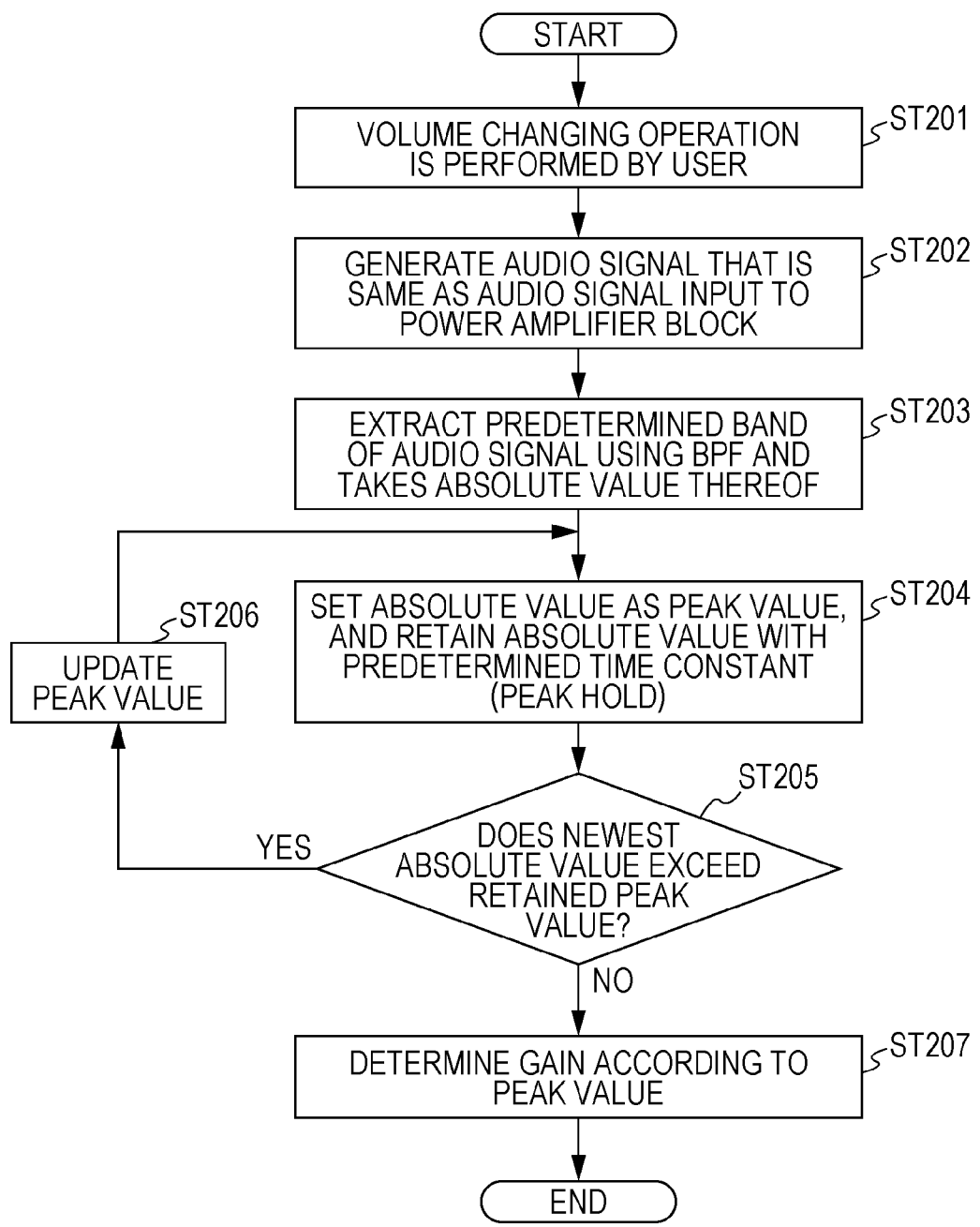
FIG. 10 is a flowchart illustrating an example of an operation of an audio signal processing device according to a second embodiment.

An example of an operation of the audio signal processing device 20 will be described with reference to a flowchart of FIG. 10. In step, ST201, a user performs a volume changing operation. According to the volume changing operation, the system control unit 110 sets a volume value in the volume setting unit 102 and the volume setting unit 210. Then, the processing proceeds to step ST202.

In step ST202, the volume setting unit 210 performs processing of combining the audio signal from the source sound source 150 and the set volume value. As a result, an audio signal is generated, which is the same as the audio signal that is supplied to the power amplifier block 160 from the volume setting unit 102. Then, the processing proceeds to step ST203.

The audio signal with a level changed by the volume setting unit 210 is supplied to the band pass filter 220. A predetermined band of the audio signal is extracted by the band pass filter 220. For example, the predetermined band is a band, which is in the vicinity of 200 Hz, in which the vibration plate of the speaker unit 170 comes to over-amplitude with a volume equal to or greater than a predetermined volume. Then, an absolute value with a level of the audio signal that passes through the band pass filter 220 by the absolute value circuit 221 is taken. Then, the processing proceeds to step ST204.

In step ST204, the peak detection/hold unit 222 retains (peak hold) the absolute value that is supplied from the absolute value circuit 221, with a predetermined time constant as a peak value. Then, the processing proceeds to step ST205.

In step ST205, it is determined whether or not the newest absolute value exceeds the peak value that is retained in the peak detection/hold unit 222. In a case where the newest absolute value exceeds the peak value, the processing proceeds to step ST206.

In step ST206, the peak value is updated. The peak detection/hold unit 222 retains the updated peak value.

In step ST205, in a case where the newest absolute value is below the peak value, the processing proceeds to step ST207. In step ST207, the comparator 223 determines whether the peak value is greater than the set level. Then, in a case where the peak value is greater than the set level, the coefficient of the two-dimensional IIR filter 101 is set in such a manner that the level of a predetermined band of the digital audio signal is suppressed.

Figure 11A:
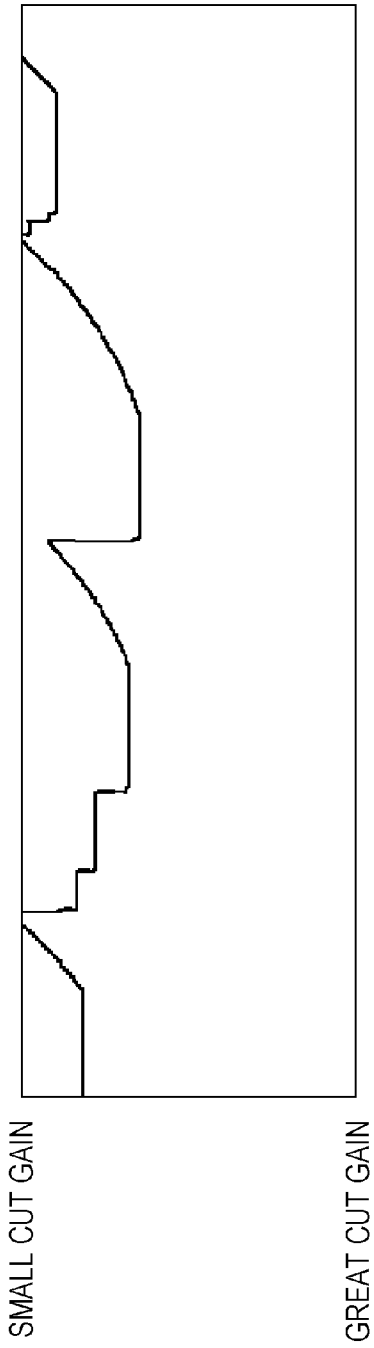
FIG. 11A illustrates an example of a gain change.
Figure 11B:
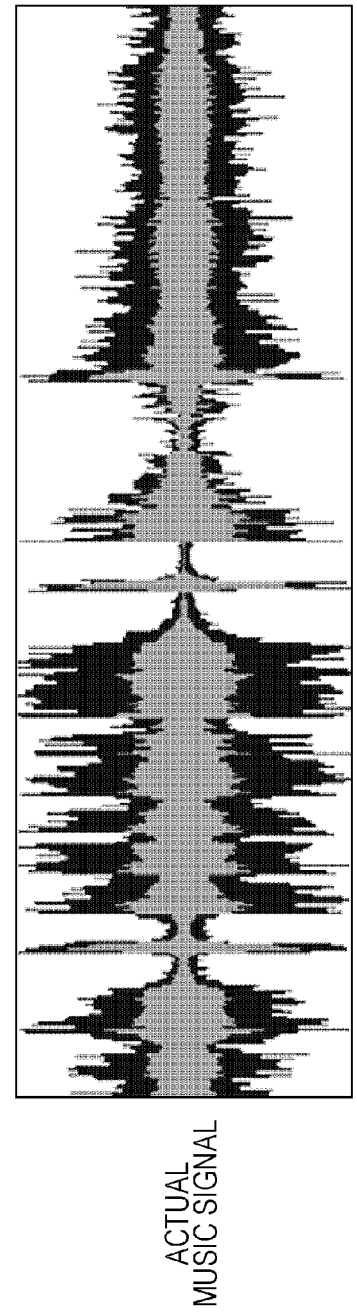
FIG. 11B is a diagram illustrating an example of an audio signal.

FIG. 11A illustrates a gain change of the two-dimensional IIR filter 101 in a case where the processing according to the second embodiment is applied, and FIG. 11B illustrates an actual audio signal. Horizontal axes of FIG. 11A and FIG. 11B denote passage of time. A vertical axis of FIG. 11A denotes a magnitude of the gain, and a vertical axis of FIG. 11B denotes the level of the audio signal. As can be seen from FIG. 11A and FIG. 11B, the gain of the two-dimensional IIR filter 101 can be dynamically changed.

As described above, in the second embodiment, only in a case where a level obtained by multiplying a source signal and the volume value exceeds a level in which the vibration plate comes to over-amplitude within a band in which the vibration plate can come to over-amplitude, the level of a signal in the band is immediately suppressed. As a result, it is possible to prevent the vibration plate from coming to over-amplitude. Furthermore, since the level of the signal is not suppressed in a band other than the band in which the vibration plate can come to over-amplitude, it is possible to prevent the vibration plate from over-vibrating, and to maintain a maximum sound pressure.

3. Modification Example

As described above, the embodiments according to the present disclosure are specifically described, but the present disclosure is not limited to the above-described embodiments, and various modifications can be made based on a technical idea of the present disclosure.

In the above description, the magnetic fluid speaker unit is described as an example, but a speaker unit to which the present disclosure can be applied is not limited to this. In addition, a speaker device using the magnetic fluid speaker unit is not limited to a bass reflex type, and the other types (for example, encapsulation type) may be used. Furthermore, the present disclosure can also be applied to preventing an abnormal sound (chatter sound) of the speaker unit. For example, by using a suppressing filter according to a resonance frequency and a volume in which the chatter sound is generated, it is possible to obtain an effect that is the same as that of the present disclosure.

The audio signal processing device according to the present disclosure can be applied to, for example, a television device, a vehicle device, a portable audio player, and a portable apparatus (smart phone, laptop computer).

The present disclosure is not limited to a device, and can be realized by a method, a program, system or the like. For example, the program can be provided to a user via a network, or via a portable memory, such as an optical disc or a semiconductor memory.

The configurations and the processing of the embodiments and the modification example can be appropriately combined with each other within a range in which a technical contradiction does not occur. A sequence of each processing in the exemplified processing flow can be appropriately changed within a range in which a technical contradiction does not occur.

The present disclosure can be applied to a so-called cloud system in which the exemplified processing is performed in a dispersed manner by a plurality of devices. In a system in which the processing exemplified in the embodiments and the modification example is performed, the present disclosure can be realized as a device in which the processing of at least a portion of the exemplified processing is performed.

The present disclosure can also be realized by the following configurations.

(1)
An audio signal processing device including: a volume setting unit that changes a volume of an audio signal according to a control for changing the volume; and a level control unit that controls a level of a predetermined band of the audio signal according to the control.

(2)
The audio signal processing device described in (1), in which the level control unit is configured so as to suppress the level of the predetermined band of the audio signal, in a case where the changed volume is greater than a set value.

(3)
The audio signal processing device described in (2), in which the level control unit is configured so as to gradually suppress the level of the predetermined band of the audio signal, according to a degree in which the changed volume is greater than the set value.

(4)
The audio signal processing device described in any one of (1) to (3), in which the level control unit is configured so as not to change the level of the predetermined band of the audio signal, in a case where the changed volume is less than a set value.

(5)
The audio signal processing device described in (1), including: a detection unit that detects the level of the predetermined band of the audio signal, in which the level control unit is configured so as to control the level of the predetermined band of the audio signal, according to a result detected by the detection unit.

(6)
The audio signal processing device described in (5), in which the detection unit including: a second volume setting unit that changes a volume of the audio signal according to the control for changing the volume; a filter through which the predetermined band of the audio signal which is output from the second volume setting unit is able to be passed; a peak retention unit that detects a peak value of a level of the audio signal that passes through the filter, retains the peak value with a predetermined time constant, and updates the peak value, in a case where a newest peak value is greater than the retained peak value; and a control value setting unit that sets a control value according to a peak value which is retained by the peak retention unit.

(7)
The audio signal processing device described in any one of (1) to (6), in which the predetermined band is a band in which a vibration plate of a speaker unit that reproduces the audio signal comes to over-amplitude, if a volume is equal to or greater than a predetermined volume.

(8)
The audio signal processing device described in (7), in which the speaker unit has a damperless structure.

(9)
The audio signal processing device described in (8), in which the speaker unit is a speaker unit in which magnetic fluid is used on the periphery of a voice coil, and the predetermined band is a band in the vicinity of 200 hertz (Hz).

(10)
An audio signal processing method of an audio signal processing device, the method including: changing a volume of an audio signal according to a control for changing the volume; and controlling a level of a predetermined band of the audio signal according to the control.

It should be understood by those skilled in the art that various modifications, combinations, sub-combinations and alterations may occur depending on design requirements and other factors insofar as they are within the scope of the appended claims or the equivalents thereof.

What is claimed is:

1. An audio signal processing device, comprising:
   a first volume setting unit that changes a volume of an audio signal based on a control that changes the volume;
   a peak retention unit that detects a peak value of a level of a determined band of the audio signal; and
   a level control unit that controls the level of the determined band of the audio signal based on the detected peak value and the control that changes the volume, wherein the level control unit is a two-dimensional infinite impulse response (IIR) filter.

2. The audio signal processing device according to claim 1, wherein the level control unit further suppresses the level of the determined band of the audio signal based on a determination that the changed volume is greater than a set value.

3. The audio signal processing device according to claim 2, wherein the level control unit further gradually suppresses the level of the determined band of the audio signal based on a degree by which the changed volume is greater than the set value.

4. The audio signal processing device according to claim 1, wherein the level control unit further maintains the level of the determined band of the audio signal unchanged based on a determination that the changed volume is less than a set value.

5. The audio signal processing device according to claim 1, further comprising:
   a detection unit that detects the level of the determined band of the audio signal,
   wherein the level control unit further controls the level of the determined band of the audio signal based on a result detected by the detection unit.

6. The audio signal processing device according to claim 5, wherein the detection unit further includes:
   a second volume setting unit that changes the volume of the audio signal based on the control for changing the volume;

a filter that passes the determined band of the audio signal output from the second volume setting unit;
the peak retention unit further:
   detects the peak value of the level of the audio signal that passes through the filter,
   retains the peak value with a determined time constant, and
   updates the peak value based on a determination that a newest peak value is greater than the peak value retained by the peak retention unit; and
a control value setting unit that sets a control value based on the peak value which is retained by the peak retention unit.

7. The audio signal processing device according to claim 1, wherein the determined band is a band in which a vibration plate of a speaker unit that reproduces the audio signal comes to over-amplitude based on a determination that the volume is equal to or greater than a determined volume.

8. The audio signal processing device according to claim 7, wherein the determined band includes 200 hertz (Hz).

9. The audio signal processing device according to claim 1, wherein coefficients of the two-dimensional IIR filter are set based on a comparison between the detected peak value and a set level.

10. The audio signal processing device according to claim 1, wherein the volume of the audio signal is set based on user input.

11. An audio signal processing method, comprising:
in an audio signal processing device comprising a two-dimensional infinite impulse response (IIR) filter:
   changing a volume of an audio signal based on a control for changing the volume;
   detecting a peak value of a level of a determined band of the audio signal; and
   controlling, by the two-dimensional IIR filter, the level of the determined band of the audio signal based on the detected peak value and the control for changing the volume.

* * * * *